United States Patent
Chen

(10) Patent No.: US 11,789,073 B2
(45) Date of Patent: Oct. 17, 2023

(54) SCAN TEST DEVICE AND SCAN TEST METHOD

(71) Applicant: REALTEK SEMICONDUCTOR CORPORATION, Hsinchu (TW)

(72) Inventor: Po-Lin Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/329,215

(22) Filed: May 25, 2021

(65) Prior Publication Data

US 2021/0373074 A1     Dec. 2, 2021

(30) Foreign Application Priority Data

Jun. 1, 2020   (TW) ................................ 109118256

(51) Int. Cl.
*G01R 31/3177*     (2006.01)
*G01R 31/317*      (2006.01)
*G01R 31/3185*     (2006.01)

(52) U.S. Cl.
CPC .... *G01R 31/3177* (2013.01); *G01R 31/31701* (2013.01); *G01R 31/31725* (2013.01); *G01R 31/31727* (2013.01); *G01R 31/318541* (2013.01); *G01R 31/318552* (2013.01); *G01R 31/318594* (2013.01)

(58) Field of Classification Search
CPC ........ G01R 31/3177; G01R 31/318552; G01R 31/31727; G01R 31/318594; G01R 31/31725; G01R 31/318541; G01R 31/31701
See application file for complete search history.

(56) References Cited

U.S. PATENT DOCUMENTS

| | | | |
|---|---|---|---|
| 2002/0162065 A1* | 10/2002 | Kashiwagi | G01R 31/318552 714/726 |
| 2003/0070118 A1* | 4/2003 | Nakao | G01R 31/318547 714/30 |
| 2010/0033189 A1* | 2/2010 | Matsumoto | G01R 31/318552 324/537 |
| 2011/0154142 A1* | 6/2011 | Son | G01R 31/31725 714/E11.155 |
| 2017/0186378 A1* | 6/2017 | Na | G09G 3/3266 |

* cited by examiner

*Primary Examiner* — Cynthia Britt
*Assistant Examiner* — Sazzad Hossain
(74) *Attorney, Agent, or Firm* — WPAT, P.C

(57) ABSTRACT

A scan test device includes a scan flip flop circuit and a clock gating circuit. The scan flip flop circuit is configured to receive a scan input signal according to a scan clock signal, and to output the received scan input signal to be a test signal. The clock gating circuit is configured to selectively mask the scan clock signal according to a predetermined bit of the test signal and a scan enable signal, in order to generate a test clock signal for testing at least one core circuit.

20 Claims, 4 Drawing Sheets

SCAN TEST DEVICE AND SCAN TEST METHOD

BACKGROUND

1. Technical Field

The present disclosure relates to a testing of an integrated circuit, especially to a scan test device that shares a scan clock signal and a scan test method.

2. Description of Related Art

In a testing of an integrated circuit, if a number of pins in a circuit under test is insufficient, multiple circuits under tests may require sharing the same scan clock signal. Under this condition, it is required to determine whether a clocking (or timing) conflict exists in circuit behaviors of the circuits under test, which reduces the testing efficiency. Moreover, if the clocking conflict exists in the circuits under test, a number of the test patterns is required to be increased to eliminate the conflict. As a result, the test cost is increased.

SUMMARY

In some embodiments, a scan test device includes a scan flip flop circuit and a clock gating circuit. The scan flip flop circuit is configured to receive a scan input signal according to a scan clock signal, and to output the received scan input signal to be a test signal. The clock gating circuit is configured to selectively mask the scan clock signal according to a predetermined bit of the test signal and a scan enable signal, in order to generate a test clock signal for testing at least one core circuit.

In some embodiments, a scan test method includes following operations: receiving a scan input signal according to a scan clock signal and outputting the received scan input signal to be a test signal; and selectively masking the scan clock signal according to a predetermined bit of the test signal and a scan enable signal, in order to generate a test clock signal for testing at least one core circuit.

These and other objectives of the present disclosure will no doubt become obvious to those of ordinary skill in the art after reading the following detailed description that are illustrated in the various figures and drawings.

DETAILED DESCRIPTION

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits. The term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference numbers.

Figure 1:
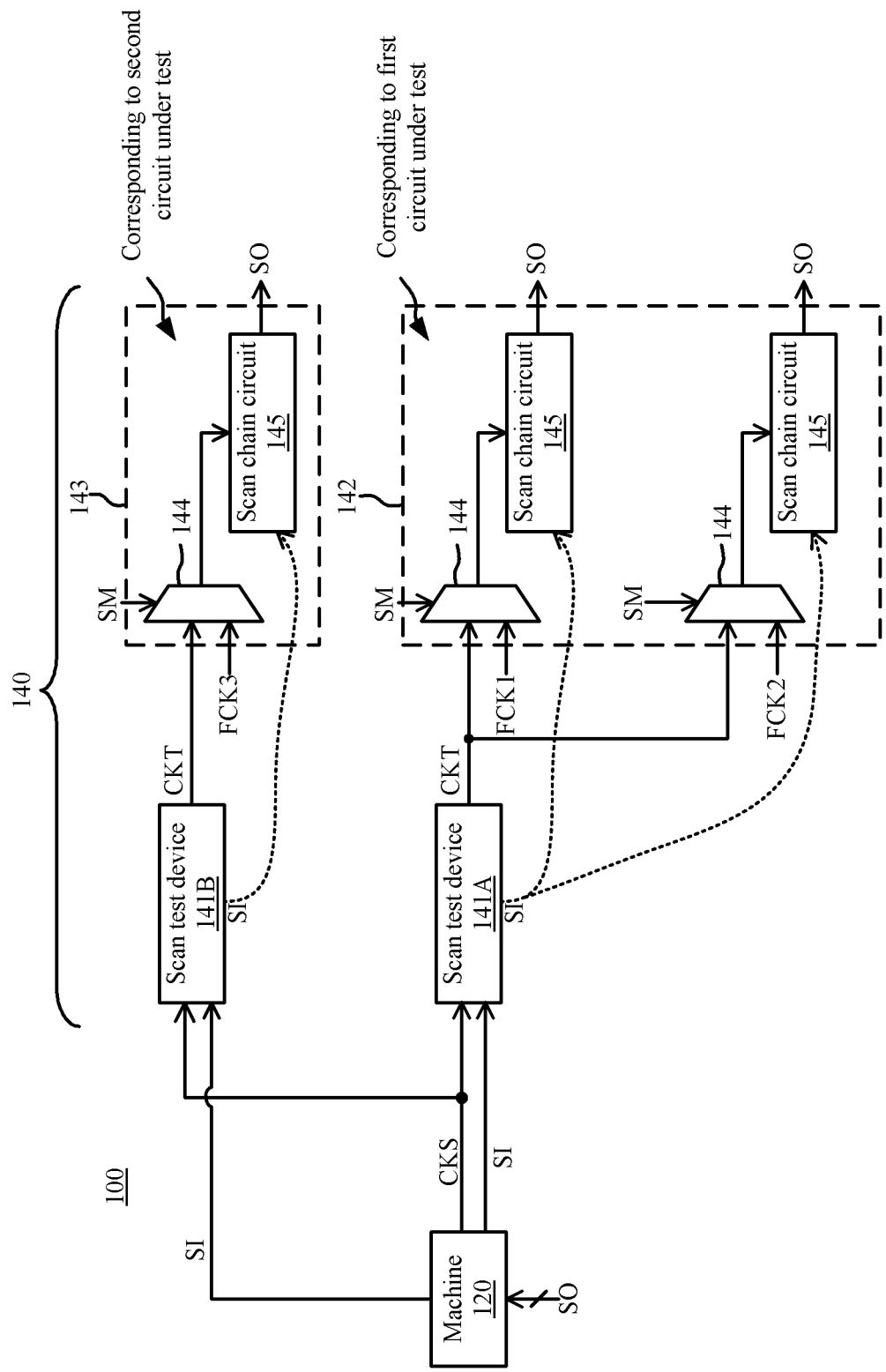
FIG. 1 is a schematic diagram of a testing system according to some embodiments of the present disclosure.

FIG. 1 is a schematic diagram of a testing system 100 according to some embodiments of the present disclosure. The testing system 100 includes a machine 120 and a circuitry under test 140. In some embodiments, the machine 120 may be an automatic test pattern generator. The machine 120 is coupled to a circuitry under test 140. The machine 120 may output a scan input signal SI and a scan clock signal CKS to the circuitry under test 140. The circuitry under test 140 generates output results SO in response to the scan input signal SI and the scan clock signal CKS. The machine 120 may capture these output results SO, and may analyze the captured output results SO to determine whether operations of circuits in the circuitry under test 140 are correct.

In some embodiments, the circuitry under test 140 includes a scan test device 141A, a scan test device 141B, and core circuits 142 and 143, in which the core circuit 142 is a first circuit under test, and the core circuit 143 is a second circuit under test. The scan test device 141A receives the scan input signal SI according to the scan clock signal CKS, and determines whether to mask the scan clock signal CKS according to a predetermined bit (e.g., a bit d[n] shown in FIG. 3) of the scan input signal SI, in order to generate a test clock signal CKT for testing the core circuit 142. Based on similar operation(s), the scan test device 141B may receive the scan input signal SI according to the scan clock signal CKS, and may determine whether to mask the scan clock signal CKS according to the predetermined bit in the scan input signal SI, in order to generate the test clock signal CKT for testing the core circuit 143.

Each the core circuit 142 and the core circuit 143 may include at least one functional circuit that has different design. For example, the core circuit 142 includes two sets of circuits, and each set of circuit includes of a scan multiplexer circuit 144 and a scan chain circuit 145, in which the first set of circuits is for testing a first functional circuit (not shown), and the second set of circuits is for testing a second functional circuit (not shown). In response to the scan mode signal SM having a first logic value, the scan multiplexer circuit 144 outputs functional clock signals to subsequent circuits, such that the core circuit 142 and the core circuit 143 perform predetermined operations. It should be understood that, for different circuit designs, the functional clock signals may be different. For example, in the core circuit 142, the scan multiplexer circuit 144 in the first set of circuits receives a functional clock signal FCK1, and the scan multiplexer circuit 144 in the second set of circuits receives a functional clock signal FCK2. In response to the scan mode signal SM having the second logic value, the scan multiplexer circuit 144 outputs a test clock signal CKT to subsequent circuits, such that the core circuit 142 operates in a scan test mode. Under this condition, the scan chain circuits 145 generate the output results SO according to the scan input signal SI and the test clock signal CKT, and provide the same to the machine 120 for checking whether the operations of the core circuit 142 are correct. In some embodiments, the scan test device 141A may transmit the scan input signal SI to each scan chain circuit 145 in the core circuit 142.

The core circuit 143 is coupled to the machine 120, in order to receive the scan clock signal CKS and another scan input signal SI. Similar to the core circuit 142, the core circuit 143 includes a scan multiplexer circuit 144 for scan test and the scan chain circuit 145 which is configured to test a third functional circuit (not shown). Based on similar operations, the scan multiplexer circuit 144 may selectively output the test clock signal CKT or a functional clock signal FCK3 to subsequent circuits according to the scan mode signal SM, such that the core circuit 143 performs a predetermined operation or operates in the scan test mode. In some embodiments, the scan test device 141B may transmit the scan input signal SI to each scan chain circuit 145 in the core circuit 143.

A number of core circuits in FIG. 1 is given for illustrative purposes, and the present disclosure is not limited thereto. In practical applications, the number of core circuit to be tested may be one or more. In some embodiments, the testing system 100 may be applied to a core wrapper flow. The arrangements among the machine 120, the core circuit 142, and the core circuit 143 are given for illustrative purposes, and the present disclosure is not limited thereto. For example, in some other applications, according to different arrangements of scan chain circuits, the scan test device 141A may transmit the scan input signal SI to the scan test device 141B.

In some related approaches, if a number of pin(s) for testing in a circuit under test is too few, multiple circuits under test are required to share one scan clock signal. Under this condition, a machine is required to verify whether clocking of each circuits under test are in conflict with each other before generating a scan input signal. As result, the testing efficiency is lower. Moreover, if the clocking of the circuits under test are in conflict with each other, the machine is required to stagger the clocking of these circuits under test to avoid the conflicts. As a result, the number of test patterns in the scan input signal would be too much, which results in higher costs of circuit testing. Compared with the above approaches, as described in following embodiments, by utilizing the scan test device 141A and the scan test device 141B, the machine 120 is able to set a predetermined bit of the scan input signal SI, in order to arrange the clocking of each circuit under test flexibly. As a result, the cost of circuit testing is prevented from being excessively increased.

Figure 2:
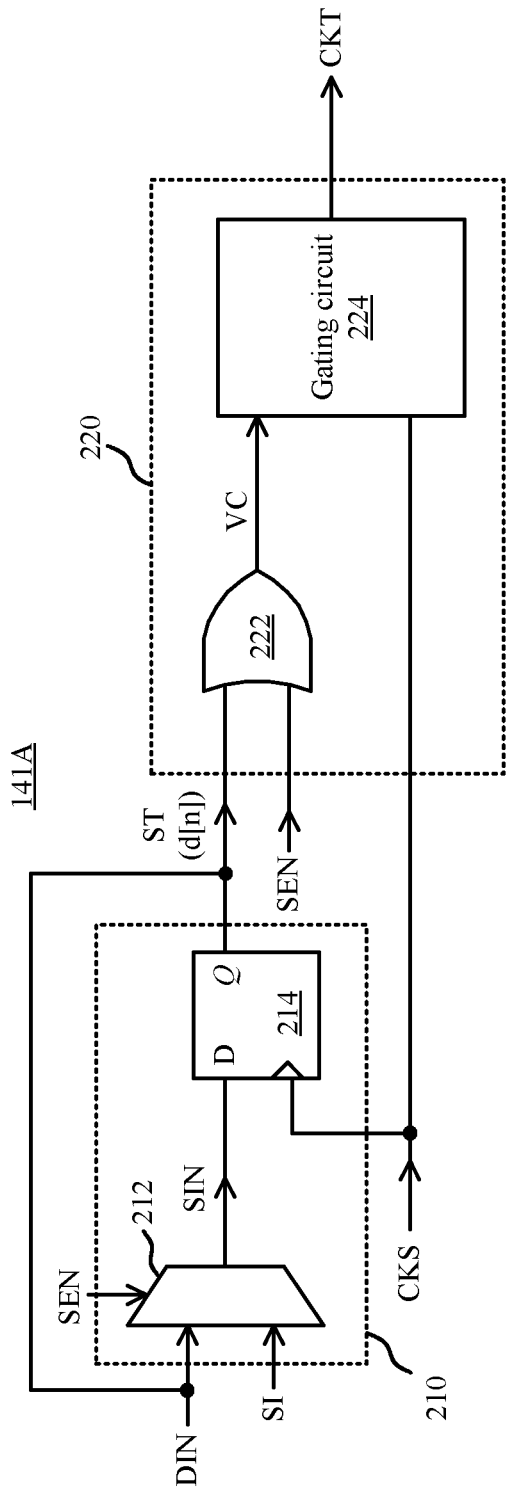
FIG. 2 is a schematic diagram of the scan test device in FIG. 1 according to some embodiments of the present disclosure.
Figure 3:
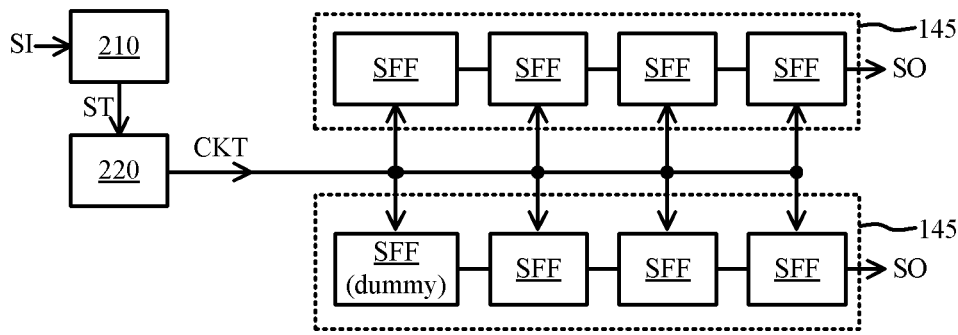
FIG. 3 is a schematic diagram illustrating connections between the scan flip flop circuit in FIG. 2 and the scan chain circuits in FIG. 1 and waveforms of the scan input signal, the scan clock signal, and the scan enable signal in FIG. 1 and/or FIG. 2 according to some embodiments of the present disclosure.
Figure 3:
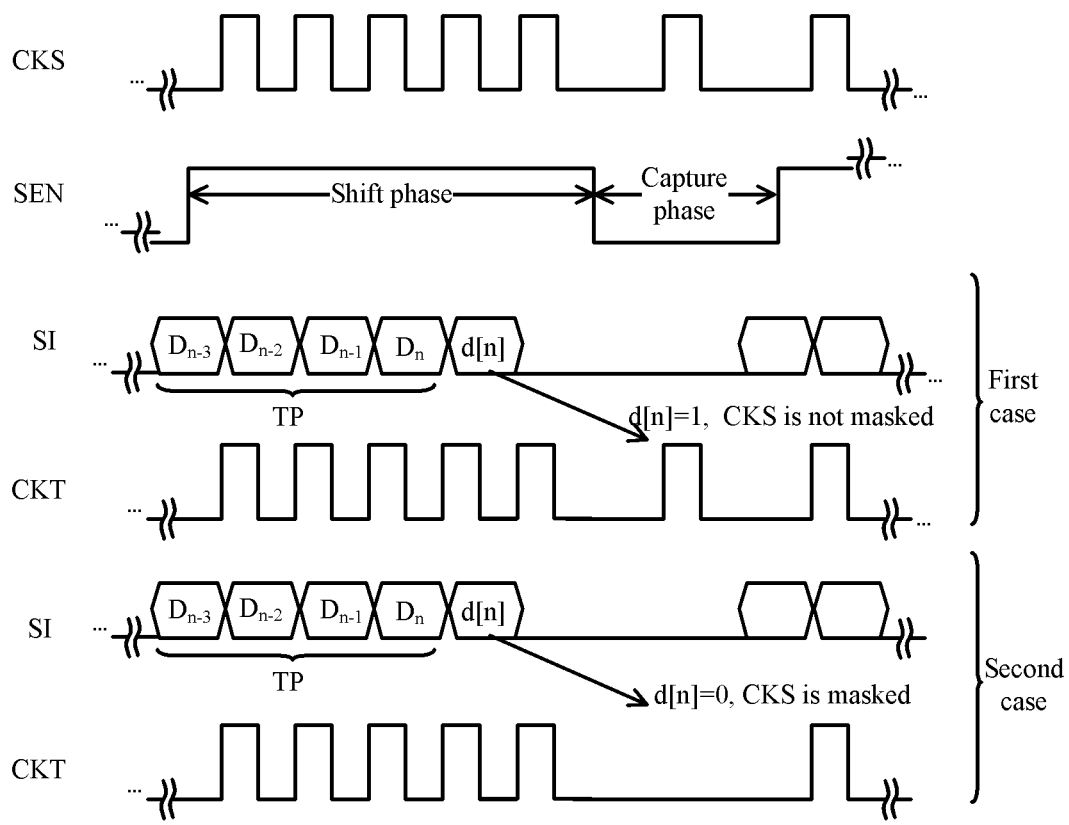

FIG. 2 is a schematic diagram of the scan test device 141A in FIG. 1 according to some embodiments of the present disclosure. The scan test device 141A includes a scan flip flop circuit 210 and a clock gating circuit 220. The scan flip flop circuit 210 receives the scan input signal SI according to the scan clock signal CKS, and outputs the received scan input signal SI to be the test signal ST. For example, the scan flip flop circuit 210 may include a multiplexer 212 and a D type flip flop 214. The multiplexer 212 includes a first input terminal for receiving normal data DIN and a second input terminal for receiving the scan input signal SI. The multiplexer 212 outputs the normal data DIN or the scan input signal SI to be the input signal IN according to a scan enable signal SEN. When the scan enable signal SEN has the first logic value, the multiplexer 212 outputs the normal data DIN to be the input signal SIN. Alternatively, when the scan enable signal SEN has the second logic value, the multiplexer 212 outputs the scan input signal SI to be the input signal SIN. Under this condition, the scan test device 141A operates under the scan test mode. The D type flip flop 214 is coupled to the multiplexer 212 and outputs the received input signal SIN to be the test signal ST according to the scan clock signal CKS. Furthermore, the first input terminal for receiving the normal data DIN of the multiplexer 212 is coupled to an output terminal of the D type flip flop 214. With the above arrangement, a signal value of the test signal ST is kept being unchanged during a capture phase (as shown in FIG. 3). The above implementations about the scan flip flop circuit 210 are given for illustrative purposes, and the present disclosure is not limited thereto.

The clock gating circuit 220 selectively masks the scan clock signal CKS according to a predetermined bit d[n] of the test signal ST and the scan enable signal SEN, in order to generate the test clock signal CKT. For example, the clock gating circuit 220 may include an OR gate 222 and a gating circuit 224. The OR gate 222 generates a control signal VC according to the predetermined bit d[n] of the test signal ST and the scan enable signal SEN. When the scan enable signal SEN has a logic value of 1, the control signal VC is kept having the logic value of 1. As a result, the gating circuit 224 does not mask the scan clock signal CKS. When the scan enable signal SEN has the logic value of 0, the OR gate 222 determines the control signal VC according to the logic value of the predetermined bit d[n]. As a result, the gating circuit 224 is able to selectively mask the scan clock signal CKS according to the control signal VC, in order to generate the test clock signal CKT. In some embodiments, the gating circuit 224 may be implemented with an integrated clock gating cell. The implementations of the clock gating circuit 220 are given for illustrative purposes, and the present disclosure is not limited thereto. In some embodiments, the machine 120 may add the predetermined bit d[n] to the scan input signal SI, in order to set clocking of the core circuits 142 and 143.

FIG. 3 is a schematic diagram illustrating connections between the scan flip flop circuit 210 in FIG. 2 and the scan chain circuits 145 in FIG. 1 and waveforms of the scan input signal SI, the scan clock signal CKS, and the scan enable signal SEN in FIG. 1 and/or FIG. 2 according to some embodiments of the present disclosure.

In some embodiments, as shown in FIG. 3 (or FIG. 1), each of the core circuit 142 and the core circuit 143 includes the scan chain circuit(s) 145. In this example, the scan chain circuit 145 in the core circuit 142 includes four scan flip flop circuits SFF that are coupled in series, and the scan chain circuit 145 in the core circuit 143 includes a dummy scan flip flop circuits SFF and three scan flip flop circuits SFF that are coupled in series. In other words, data in each scan chain circuit 145 are set to be shifted four times. The scan chain circuits 145 further receive the test clock signal CKT, and generate the output results SO according to the test clock signal CKT and the scan input signal SI. In some embodiments, as shown in FIG. 1, the scan flip flop circuit 210 is coupled to a first scan flip flop circuit SFF in each scan chain circuit 145, in order to transmit the scan input signal SI.

During a shift phase of the scan enable signal SEN, the scan enable signal SEN has a level corresponding to the logic value of 1. During the shift phase, the circuitry under test 140 operates under the scan test mode, and the scan chain circuit 145 receives the scan input signal SI. During a capture phase of the scan enable signal SEN, the scan enable signal SEN has a level corresponding to the logic value of 0. During the capture phase, the scan chain circuits 145 generate the output results SO in response to circuit behavior of the corresponding core circuit.

During the shift phase, the scan input signal SI includes the testing pattern TP (which sequentially includes, for example, a bit $D_{n-3}$, a bit $D_{n-2}$, a bit $D_{n-1}$, a bit $D_n$) and the predetermined bit Mil During the shift phase, the scan chain circuit 145 is triggered by pulses of the scan clock signal to shift inputs, in order to sequentially read the bit $D_{n-3}$, the bit $D_{n-2}$, the bit $D_{n-1}$, the bit $D_n$, and the predetermined bit d[n]. In this example, the predetermined bit d[n] is configured to follow the testing pattern TP, and is to be a fifth bit in the shift phase, but the present disclosure is not limited thereto. In some embodiments, the predetermined bit d[n] may any bit of the scan input signal SI. During the capture phase, the scan clock signal CKS has at least one pulse (i.e., the scan clock signal CKS has an always-capture waveform).

In this example, assumed that the circuit behavior of the core circuit 142 requires clock(s) during the capture phase, and the circuit behavior of the core circuit 143 does not require clock(s) during the capture phase. In a first case, the machine 120 sets the predetermined bit d[n] to have the logic value of 1. At the end of the shift phase, the scan flip flop circuit 210 latches the predetermined bit d[n] having the logic value of 1. In response to this predetermined bit d[n], the clock gating circuit 220 does not mask the pulses of the scan clock signal CKS in the capture phase, in order to generate the test clock signal CKT. As a result, the machine 120 is able to obtain the output results SO for checking the core circuit 142. Alternatively, in a second case, the machine 120 sets the predetermined bit d[n] to have the logic value of 0. At the end of the shift phase, the scan flip flop circuit 210 latches the predetermined bit d[n] having the logic value of 0. In response to this predetermined bit d[n], the clock gating circuit 220 masks pulse(s) of the scan clock signal CKS in the capture phase, in order to generate the test clock signal CKT. As a result, the machine 120 obtains the output results SO for checking the core circuit 143.

With the above mechanism, the machine 120 is able to kept outputting the scan clock signal CKS having the always-capture waveform, and to set clocking of various circuits under test with the predetermined bit d[n]. As a result, test cost is prevented from being increased, and the adaptability of the scan test is improved.

The above connections between the scan flip flop circuit 210 and the scan chain circuits 145 and the bit position of the predetermined bit d[n] are given for illustrative purposes. According to different applications or testing requirements, the connections between the scan flip flop circuit 210 and the scan chain circuits 145 and the bit position of the predetermined bit d[n] can be adjusted correspondingly. In some embodiments, the above bit (and/or the predetermined bit) may be a data value corresponding to digital data having a predetermined format.

Figure 4:
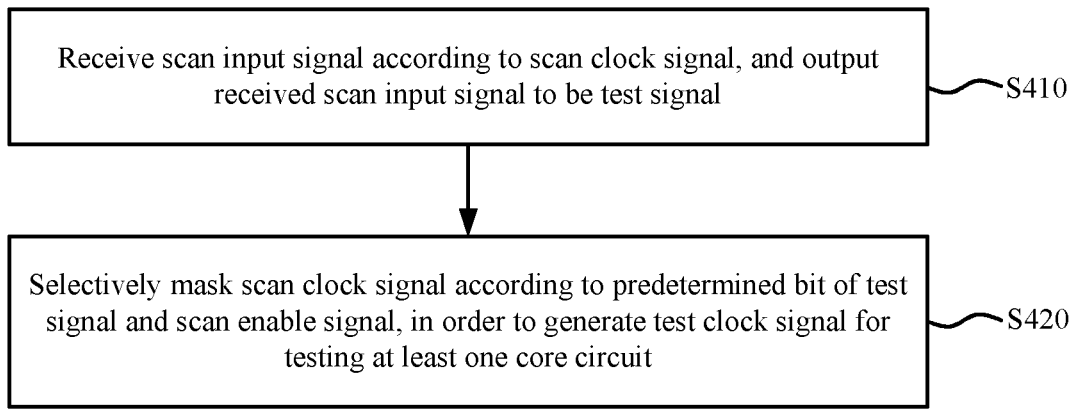
FIG. 4 is a flow chart of a scan test method according to some embodiments of the present disclosure.

FIG. 4 is a flow chart of a scan test method 400 according to some embodiments of the present disclosure. In operation 5410, the scan input signal is received according to the scan clock signal, and the received scan input signal is outputted to be the test signal. In operation 5420, the scan clock signal is selectively masked according to a predetermined bit in the test signal and the scan enable signal, in order to generate a test clock signal for testing at least one core circuit.

Operations 5410 and 5420 can be understood with reference to various embodiments mentioned above, and thus the repetitious descriptions are not given. The above description of the scan test method 400 includes exemplary operations, but the operations of the scan test method 400 are not necessarily performed in the order described above. The order of the operations of the scan test method 400 can be changed, or the operations can be executed simultaneously or partially simultaneously as appropriate, in accordance with the spirit and scope of various embodiments of the present disclosure.

As described above, the scant test device and the second test method provided in some embodiments of the present disclosure employ a control circuit having small area and a predetermined bit to set various clocking(s) of circuits under test. As a result, the test on circuits under test can be performed in more flexible and more efficient way without excessively increasing the test cost.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A scan test device, comprising:
a scan flip flop circuit configured to receive a scan input signal according to a scan clock signal, and to output the received scan input signal to be a test signal; and
a clock gating circuit configured to selectively mask the scan clock signal according to a predetermined bit of the test signal and a scan enable signal, in order to generate a test clock signal for testing at least one core circuit,
wherein the scan clock signal has at least one first pulse during the clock gating circuit selectively masks the scan clock signal, and at least one second pulse, which corresponds to the at least one first pulse, of the test clock signal is masked in response to the scan clock signal being masked by the clock gating circuit.

2. The scan test device of claim 1, wherein the scan flip flop circuit is configured to receive a test pattern and the predetermined bit in the scan input signal during a shift phase of the scan enable signal, in order to output the test signal.

3. The scan test device of claim 2, wherein the predetermined bit is configured to follow the test pattern.

4. The scan test device of claim 1, wherein the clock gating circuit comprises:
   an OR gate configured to output a control signal according to the predetermined bit and the scan enable signal; and
   a gating circuit configured to selectively mask the scan clock signal according to the control signal, in order to generate the test clock signal.

5. The scan test device of claim 1, wherein the clock gating circuit is configured to selectively mask the scan clock signal during a capture phase of the scan enable signal, in order to output the test clock signal.

6. The scan test device of claim 1, wherein the scan flip flop circuit comprises a first input terminal, a second input terminal, and an output terminal, the first input terminal is configured to receive data, the second input terminal is configured to receive the scan input signal, and the output terminal is coupled to the first input terminal and is configured to output the test signal.

7. The scan test device of claim 1, wherein the scan clock signal has an always-capture waveform.

8. The scan test device of claim 1, wherein the scan flip flop circuit comprises:
   a multiplexer configured to selectively output data or the scan input signal to be an input signal according to the scan enable signal; and
   a D type flip flop configured to output the input signal to be the test signal according to the scan clock signal, wherein an output terminal of the D type flip flop is coupled to an input terminal for receiving the data of the multiplexer.

9. The scan test device of claim 1, wherein the at least one core circuit comprises a scan chain circuit, and the scan flip flop circuit is coupled to the scan chain circuit.

10. The scan test device of claim 1, wherein the scan clock signal has the at least one first pulse during a capture phase of the scan enable signal.

11. The scan test device of claim 1, wherein the test clock signal is equal to the scan clock signal in response to the scan clock signal not being masked by the clock gating circuit.

12. A scan test method, comprising:
   receiving a scan input signal according to a scan clock signal and outputting the received scan input signal to be a test signal; and
   selectively masking the scan clock signal according to a predetermined bit of the test signal and a scan enable signal, in order to generate a test clock signal for testing at least one core circuit,
   wherein the scan clock signal has at least one first pulse during the scan clock signal is being selectively masked, and at least one second pulse, which corresponds to the at least one first pulse, of the test clock signal is masked in response to the scan clock signal being masked.

13. The scan test method of claim 12, wherein receiving the scan input signal according to the scan clock signal, and to output the received scan input signal to be the test signal comprises:
   receiving a test pattern and the predetermined bit in the scan input signal during a shift phase of the scan enable signal, in order to output the test signal.

14. The scan test method of claim 13, wherein the predetermined bit is configured to follow the test pattern.

15. The scan test method of claim 12, wherein selectively masking the scan clock signal according to the predetermined bit of the test signal and the scan enable signal, in order to generate the test clock signal for testing the at least one core circuit comprises:
   selectively masking the scan clock signal during a capture phase of the scan enable signal, in order to output the test clock signal.

16. The scan test method of claim 12, wherein selectively masking the scan clock signal according to the predetermined bit of the test signal and the scan enable signal, in order to generate the test clock signal for testing the at least one core circuit comprises:
   outputting, by an OR gate, a control signal according to the predetermined bit and the scan enable signal; and
   selectively masking, by a gating circuit, the scan clock signal according to the control signal, in order to generate the test clock signal.

17. The scan test method of claim 12, wherein the scan clock signal has an always-capture waveform.

18. The scan test method of claim 12, wherein the scan clock signal has the at least one first pulse during a capture phase of the scan enable signal.

19. The scan test method of claim 12, wherein the test clock signal is equal to the scan clock signal in response to the scan clock signal not being masked.

20. A scan test device, comprising:
   a scan flip flop circuit configured to receive a scan input signal according to a scan clock signal, and to output the received scan input signal to be a test signal; and
   a clock gating circuit configured to selectively mask the scan clock signal according to a predetermined bit of the test signal and a scan enable signal, in order to generate a test clock signal for testing at least one core circuit,
   wherein the scan clock signal has at least one pulse during the clock gating circuit selectively masks the scan clock signal, and the test clock signal is equal to the scan clock signal in response to the scan clock signal not being masked by the clock gating circuit.

* * * * *